US008059412B2

(12) United States Patent
Perkins, III et al.

(10) Patent No.: US 8,059,412 B2
(45) Date of Patent: *Nov. 15, 2011

(54) INTEGRATED POWER SUPPLY AND PLATFORM FOR MILITARY RADIO

(75) Inventors: Frank N. Perkins, III, Huntsville, AL (US); Jeffery K. Taylor, Joppa, AL (US); Bruce Weddendorf, Huntsville, AL (US); Lloyd W. Childs, Huntsville, AL (US)

(73) Assignee: Perkins Technical Services, Inc., Huntsville, AL (US)

( * ) Notice: Subject to any disclaimer, the term of this patent is extended or adjusted under 35 U.S.C. 154(b) by 256 days.

This patent is subject to a terminal disclaimer.

(21) Appl. No.: 12/359,947

(22) Filed: Jan. 26, 2009

(65) Prior Publication Data

US 2009/0168370 A1 Jul. 2, 2009

Related U.S. Application Data

(63) Continuation-in-part of application No. 11/748,770, filed on May 15, 2007, now Pat. No. 7,733,658, which is a continuation-in-part of application No. 10/895,683, filed on Jul. 21, 2004, now Pat. No. 7,227,755, which is a continuation-in-part of application No. 10/017,411, filed on Dec. 14, 2001, now Pat. No. 6,784,570.

(51) Int. Cl.
*H05K 7/00* (2006.01)
*H05K 5/00* (2006.01)

(52) U.S. Cl. .......... 361/729; 361/752; 361/600
(58) Field of Classification Search .......... 361/752
See application file for complete search history.

(56) References Cited

U.S. PATENT DOCUMENTS

| 5,604,663 | A | * | 2/1997 | Shin et al. | 361/679.43 |
|---|---|---|---|---|---|
| 5,687,061 | A | * | 11/1997 | Mesfin et al. | 361/679.41 |
| 5,966,285 | A | * | 10/1999 | Sellers | 361/679.41 |
| 6,163,086 | A | * | 12/2000 | Choo | 307/43 |
| 6,231,371 | B1 | * | 5/2001 | Helot | 439/374 |
| 6,625,015 | B2 | * | 9/2003 | Yin | 361/679.4 |
| 7,099,152 | B2 | * | 8/2006 | Gasbarro et al. | 361/679.4 |
| 7,397,907 | B2 | * | 7/2008 | Petite | 379/155 |
| 7,719,132 | B2 | * | 5/2010 | Hatten et al. | 307/9.1 |
| 2010/0067619 | A1 | * | 3/2010 | Furman et al. | 375/326 |
| 2010/0067634 | A1 | * | 3/2010 | Furman et al. | 375/376 |

* cited by examiner

*Primary Examiner* — Xiaoliang Chen
*Assistant Examiner* — Nathan Milakovich
(74) *Attorney, Agent, or Firm* — David E. Mixon; Frank M. Caprio; Bradley Arant Boult Cummings LLP

(57) ABSTRACT

An improved power supply and platform for a military radio has been developed. The apparatus includes a base that is adapted and arranged for supporting a HARRIS 117 radio and a power amplifier adapted to amplify radio frequency output of the radio. The connectors include an electrical connector for the radio and a connector for the amplifier. A power supply is housed within the assembly. A power supply for the connector to the amplifier is also housed within the assembly. Also included is a wiring harness for a SINCGARS LS/671 device and a LED indicator to identify which radio is in operation for multiple radio configurations.

33 Claims, 4 Drawing Sheets

INTEGRATED POWER SUPPLY AND PLATFORM FOR MILITARY RADIO

CROSS-REFERENCE TO RELATED APPLICATIONS

This application is a continuation-in-part of U.S. patent application Ser. No. 11/748,770 that was filed on May 15, 2007 now U.S. Pat. No. 7,733,658, which is a continuation-in-part of U.S. patent application Ser. No. 10/895,683, now U.S. Pat. No. 7,227,755 that was filed on Jul. 21, 2004, which is a continuation-in-part of U.S. patent application Ser. No. 10/017,411, now U.S. Pat. No. 6,784,570 that was filed on Dec. 14, 2001.

FIELD OF THE INVENTION

The present invention relates generally to an integrated power supply and docking platform. In particular, the present invention relates to an integrated power supply and docking platform for a Satellite Communications (SATCOM) radio frequency power amplifier for forming a single physical platform with integrated power electronics.

BACKGROUND ART

The U.S. Department of Defense employs a type of UHF, VHF-FM, and SATCOM combat net radio known as the "Harris 117 Radio". These radios have a military nomenclature of AN/PRC-117. The HARRIS 117 radios, are designed to provide the primary means of tactical communications and control for U.S. ground mounted and dismounted units, all in coordination with naval and air support. HARRIS 117 radios are designed on a modular basis for achieving maximum commonality among the various ground airborne system configurations of the armed forces. HARRIS 117 radios provide U.S. military commanders with a highly reliable, secure, and easily maintainable tactical radio net.

HARRIS 117 radios possess a nominal input power requirements of 24-32 volts direct current, which is supplied by rechargeable on-board batteries. Recharging the HARRIS 117 radio batteries is inconvenient and, in certain mission applications, unattainable. Currently, specialized and complex battery recharging systems are available for recharging HARRIS 117 radio batteries; however, these systems are not always operable in a given application.

SUMMARY OF THE INVENTION

In some aspects, the invention relates to an adapter assembly comprising: a base having a front side and a back side, said base being adapted and arranged for supporting a HARRIS 117 radio and a power amplifier adapted to amplify said radio frequency output of said HARRIS 117 radio; a first connector adapted and arranged for electrically connecting with said HARRIS 117 radio; a second connector adapted and arranged for electrically connecting with said power amplifier; a first power supply electrically connected with said first connector, said first power supply being housed within said assembly; a second power supply and a third power supply, said second power supply and said third power supply each being electrically connected with said second connector and housed within said assembly; a light emitting diode which indicates when the radio is active to enable the radio operator to identify which radio is in operation when multiple radios are installed in one location; and the inclusion of integrated wiring to allow the use of the SINCGARS LS/671 with the Harris 117 series of radios.

In other aspects, the invention relates to an adapter assembly comprising: a base having a front side and a back side, said base being adapted and arranged for supporting a HARRIS 117 radio; a first member extending upward from said base; a second member extending upward from said base; a plurality of power supplies housed within at least part said of said assembly; a first connector supported by said first member, said first connector being and arranged for supplying power from at least one of said plurality power supplies to said HARRIS 117 radio; and a second connector supported by said second member, said second connector being adapted and arranged for supplying power from at least two of said plurality of power supplies to said radio frequency power amplifier.

In other aspects, the invention relates to an adapter assembly comprising: a base having a front side and a back side, said base being adapted and arranged for supporting a HARRIS 117 radio; a first member extending upward from said back side of said base; a first forward facing connector supported by said first member and adapted to engage a complimentary connector of said HARRIS 117 radio; a first power supply in electrical connection with said first forward facing connector; and a means for converting audio electric signals into audibly detectable sounds, wherein said means is supported by said base.

Other aspects and advantages of the invention will be apparent from the following description and the appended claims.

BRIEF DESCRIPTION OF DRAWINGS

It should be noted that identical features in different drawings are shown with the same reference numeral.

DETAILED DESCRIPTION

Figure 1:
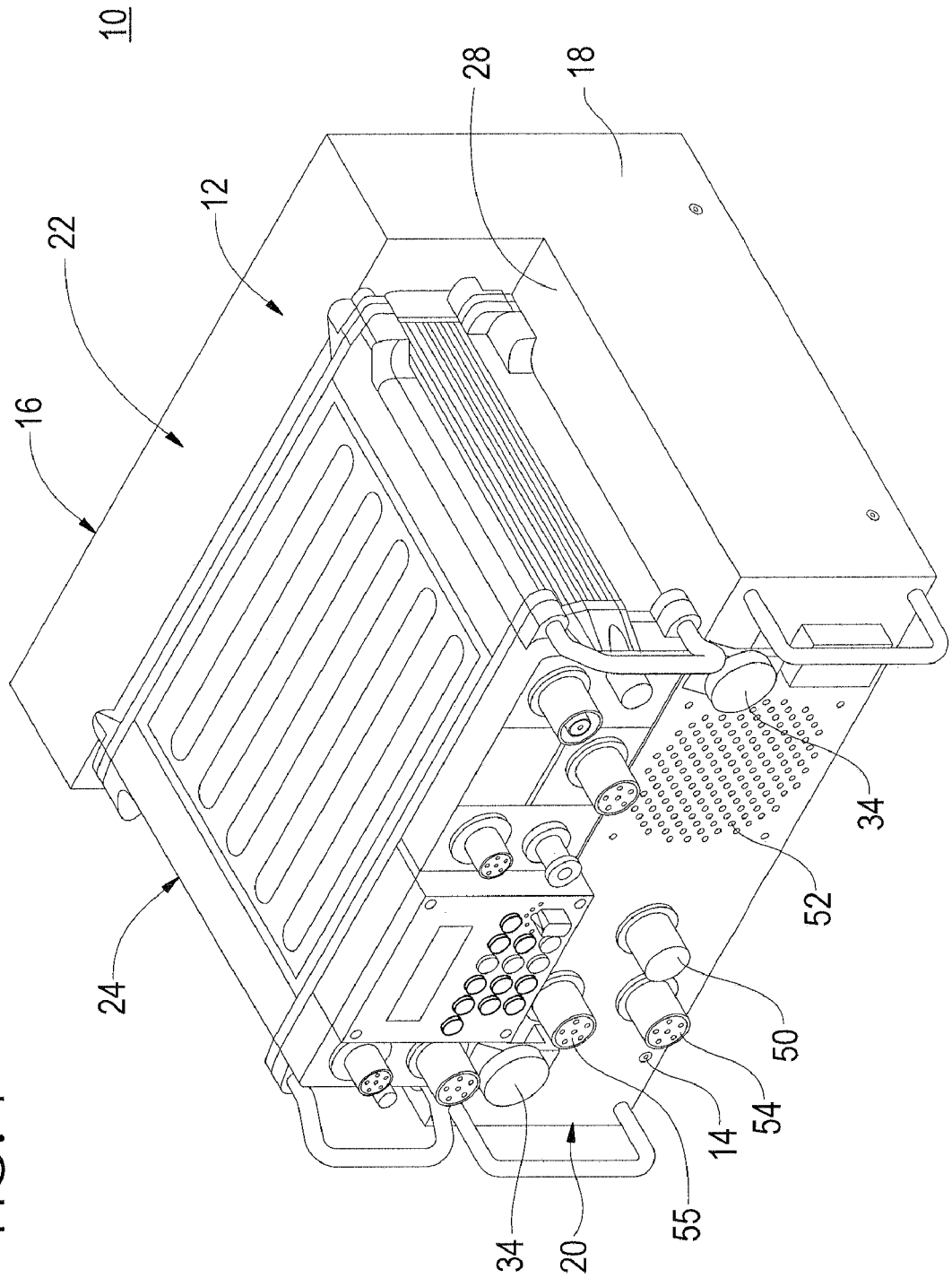
FIG. 1 is a perspective view of one embodiment of the present invention showing a HARRIS 117 radio.
Figure 2:
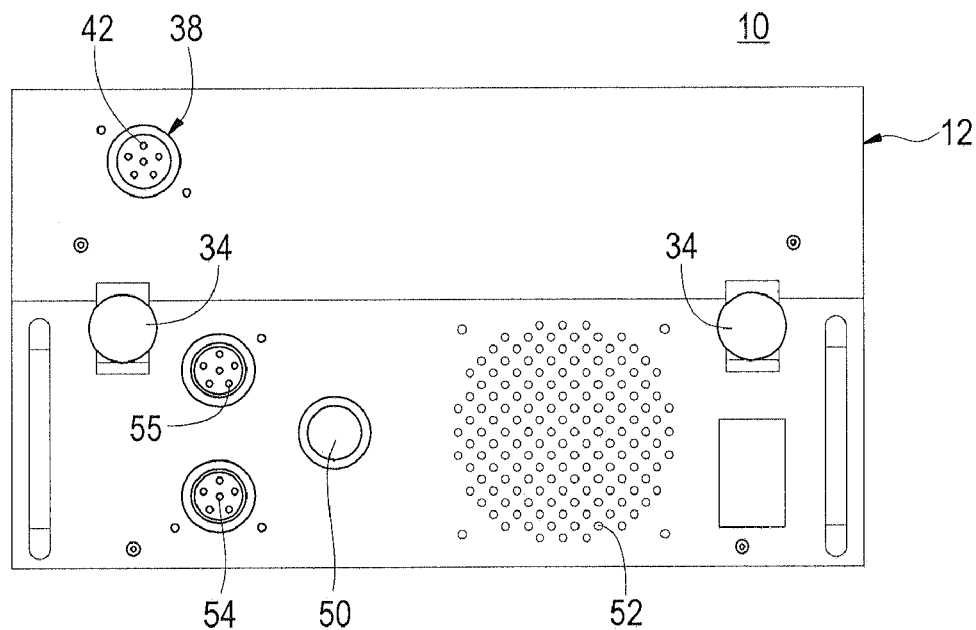
FIG. 2 is a front elevation view of the invention of FIG. 1 without the HARRIS 117 radio.
Figure 3:
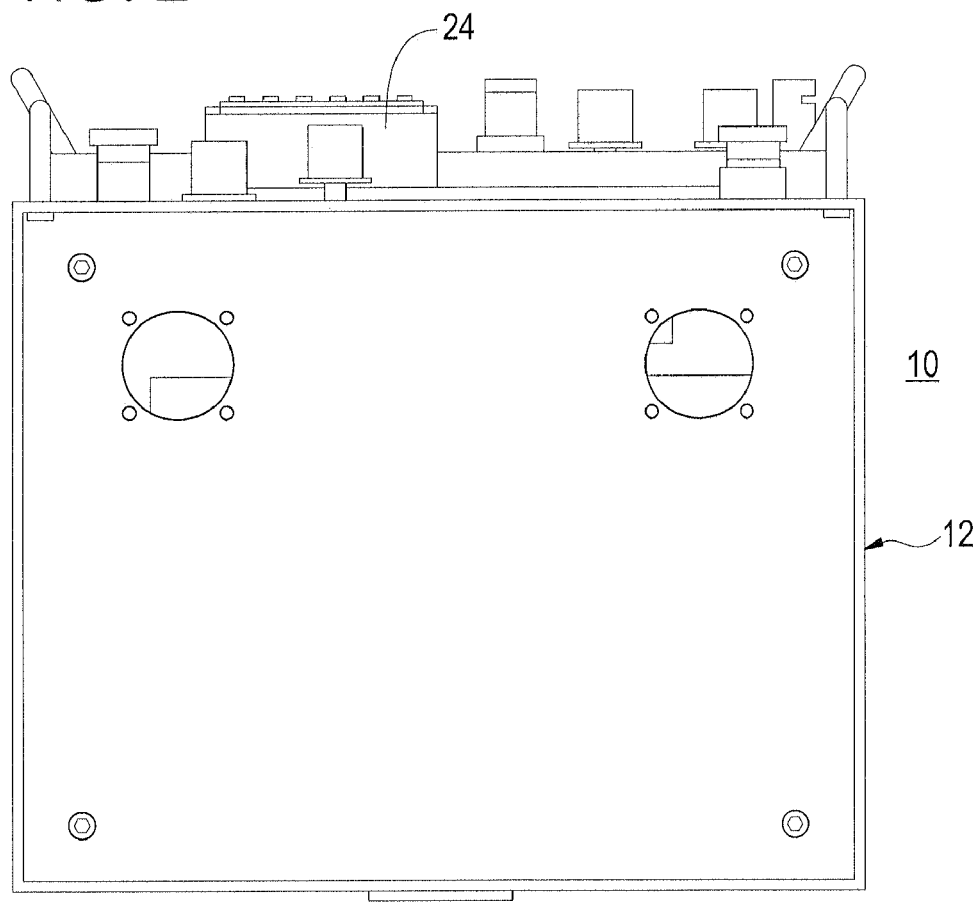
FIG. 3 is a bottom elevation view of the invention of FIG. 1.

An exemplary embodiment of the present invention is illustrated in FIGS. 1-5, where like portions share like numbering. As illustrated at FIGS. 1 through 4, an adapter assembly 10, in accordance with the present embodiment, includes a base 12 having a front side 14, a back side 16, opposing lateral sides 18 and 20 and a top side 22. Top side 22 is adapted to simultaneously support a HARRIS 117 radio 24. To that end, top side 22 includes a substantially flat, horizontal first platform 28 for supporting HARRIS 117 radio.

Extending upward from top side 22 at a 90 degree angle and forming a portion of backside 16 is the support structures for further supporting HARRIS 117 radio 24. More particularly, the support structures include a vertical support clamps 34 extending upward from the platform 28 and having a width corresponding to the width of the platform 28.

A first connector 38 is positioned and arranged so that first connector 38 is in alignment and capable of interfacing with a complementary receptor socket on the rear of HARRIS 117 radio 24, when radio 24 is installed on the platform 28. A suitable connector for use as first electrical connector 38 is 6 pin radio connector type designed and manufactured by Perkins Technical Services, Inc. Receptor contacts 42 are positioned within first connector 38 to receive corresponding male connectors extending within the complementary receptor socket on the rear side of HARRIS 117 radio 24 in accordance with government specifications established for HARRIS 117 radios and HARRIS 117 SATCOM and radio frequency power amplifiers.

2 binding Posts are positioned on the backside to provide direct current take off power for the external power amplifier. in accordance with government specifications established for HARRIS 117 radios and HARRIS 117 SATCOM and radio frequency power amplifiers. A third binding post is positioned as a ground drain for external power amplifiers requiring a ground.

A control switch 50 is provided on front side 14 of base 12 for controlling the initiation of power and/or charging for HARRIS 117 radio 24 when installed on adaptor assembly 10. The front side 14 further includes a set of speaker access holes 52 and a microphone adapter 54. The set of speaker access holes 52 allows sound generated by a phone speaker housed within base 12 to exit base 12, while microphone adapters 54, 55 provide a means of connecting the input/output of a HARRIS 117 radio handset to speaker to allow microphone out signals to be transmitted to an audio amplifier circuit and ultimately to speaker.

Opposite front side 14, a standard power plug 58 is supported within back side 16 and is adapted to plug into a standard 110/220 volt household outlet via an electrical cord. The backside also includes a subminature "D" 26 pin connector allowing access to the connector from the backside of the Harris 177 radio 24. Additionally a subminature "D" 9 pin connector to allow the radio to be controlled by TOCNET and a Circular connector to provide the ability of the unit to accommodate a LS/671 SINCGARS External Speaker with Microphone/Handset. Backside 16 further includes a pair of fan access holes 60 to allow a flow of air through base 12 as generated by a pair of fans.

Figure 4:
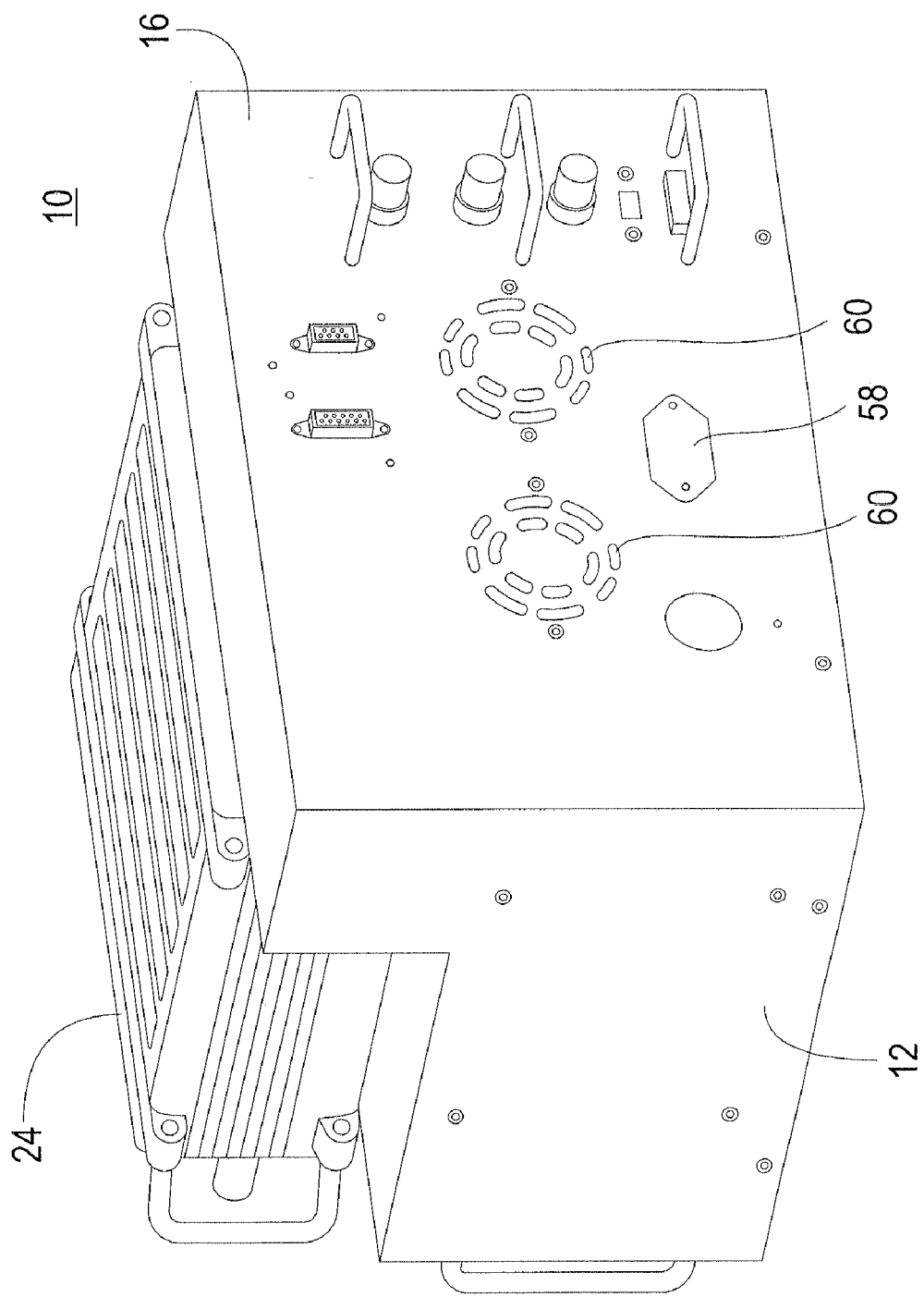
FIG. 4 is a back elevation view of the invention of FIG. 1.
Figure 5:
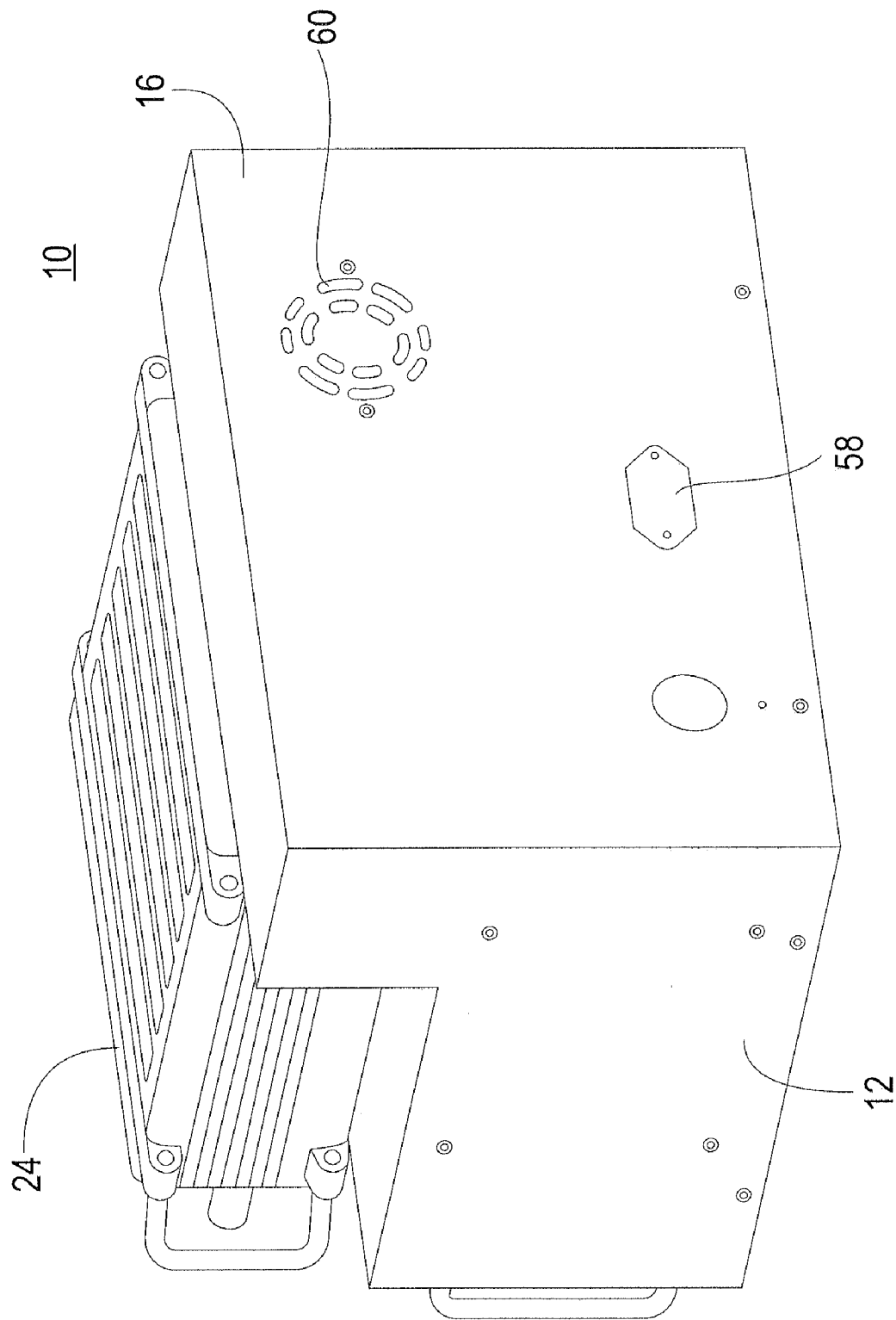
FIG. 5 is a back elevation view of the invention of FIG. 1 with a HARRIS 150 radio.

Referring now to FIGS. 4 and 5, the present embodiment of the invention includes a power supply subsystem for converting standard household 110/220 Volt alternating current into direct current and supplying it to first connector 38 as +24 Volt direct current. When control switch 50 is closed, a power supply converts alternating current power into direct current power at voltage levels required for HARRIS 117 radio 24, i.e., +24 Volt direct current, and outputs the converted power to first connector 38 to allow for powering of HARRIS 117 radio 24 when installed or docked onto adapter assembly 10. A suitable power supply is an ADA600F power supply manufactured by Cosel U.S.A Inc located in San Jose, Calif.

Audio amplifier circuit is design with a five watt audio amplifier IC LM384N manufactured by National Semiconductor. Audio amplifier circuit acts as a power amplifier and relay for electrical signals generated by the HARRIS 117 radio handset when connected via microphone adapters 54, 55. In this manner, communications exchanged through the handset can be heard via speaker and the volume amplifier circuit provides a power boost of 34 db maximum and operates off the +24 Volt input supply. The output is frequency limited by a low pass output filter. The output level is controlled via 20 k ohm resistor mounted on the front of the unit.

Inasmuch as power supply conversions and power switch wiring are well-known in the electrical arts, further discussion as to the electrical characteristics and properties of the internal power supplies for converting standard 110/220 volt AC into direct current will not be discussed as they are not necessary for a complete understanding of the invention herein described.

An adapter line connects the input/output of the HARRIS 117 radio 24 handset line to the adaptor assembly 10 and internal microphone electronic, and line connects radio handset with the adaptor assembly 10 to allow the transmission of voice communications (i.e. audio signals) to and from the handset. Additional electrical communications also occurs with the HARRIS 117 radio 24 via connectors 38 and 44 The combination of the HARRIS 117 radio 24, and the adaptor 10 allow the HARRIS 117 radio 24 to operate while allowing others in the vicinity of the adaptor unit 10 to hear incoming and outgoing voice transmissions. The LS/671 Speaker connector located on the back of the unit is connected into this circuitry. This allows the LS/671 it broadcast the audio from the handset plugged into the front of the unit as well as the communications received into the radio. The speaker on the front of the basestation will also broadcast the audio signals from the Handset plugged into the LS/671 External SINCGARS Speaker.

While the invention is shown in one form, it will be obvious to those skilled in the art that it is not so limited but is susceptible of various changes and modifications without departing from the spirit thereof. For example, various plug placements on the rear member of the invention as well as to accommodate upgrades and modifications to the current HARRIS 117 radios used by the Armed Forces. Moreover, the height of the rear member and orientation of the electrical plug on the rear of the invention could easily be varied to accommodate different types of radio configurations. These include the HARRIS 150 class of radios as well as other variations and versions of the radios and communications equipment. In general, it is physical dimensions to meet various types of HARRIS 117 radio configurations exist, such as those in existing model numbers: Ground ICOM radios using receiver-transmitter. These models are fully intended to be used and are compatible with embodiments of the present invention.

What is claimed is:

1. An adapter assembly comprising:
   a. a base having a front side and a back side, said base being adapted and arranged for supporting a HARRIS 117 radio and a power amplifier adapted to amplify said radio frequency output of said HARRIS 117 radio;
   b. a first connector adapted and arranged for electrically connecting with said HARRIS 117 radio;
   c. a second connector adapted and arranged for electrically connecting with said power amplifier;
   d. a first power supply electrically connected with said first connector, said first power supply being housed within said assembly;
   e. a second power supply and a third power supply, said second power supply and said third power supply each being electrically connected with said second connector and housed within said assembly;
   f. a light emitting diode which indicates when the radio is active to enable the radio operator to identify which radio is in operation when multiple radios are installed in one location; and
   g. the inclusion of integrated wiring to allow the use of the SINCGARS LS/671 with the HARRIS 117 series of radios.

2. The assembly according to claim 1 wherein said first power supply and said second power supply each includes a DC power converter for converting 110/220 alternating current into direct current.

3. The assembly according to claim 2 wherein said DC power converters of said first power supply converts 110/220 alternating current into 24 Volt direct current.

4. The assembly according to claim 1 further comprising a first member extending upward from said base, said first member supporting said first connector.

5. The assembly according to claim 1 further comprising a first member extending upward from said base, said first member supporting said first connector, and a second member extending upward from said base, said second member supporting said second connector.

6. The assembly according to claim 5 wherein said first member and said second member extend upward from said backside of said base.

7. The assembly according to claim 1 further comprising a speaker integral with said base, said speaker being in electrical connection with an audio amplifier circuit of said third power supply.

8. The assembly according to claim 7 wherein said speaker is supported by said front side of said base.

9. The assembly according to claim 7 wherein a volume control is electrically connected with said audio amplifier circuit.

10. The assembly according to claim 7 wherein said audio amplifier circuit includes means for electrically connecting with an external microphone.

11. The assembly according to claim 1 further including at least one fan in electrical Connection between said first connector and said first power supply.

12. The assembly according to claim 1 wherein said base is substantially rectangular.

13. The assembly according to claim 1 further comprising said HARRIS 117 radio and said amplifier being electrically connected with said first connector and said second connector, respectively.

14. The assembly according to claim 1 wherein said base includes low friction runners for arresting movement of said HARRIS 117 radio.

15. The assembly according to claim 7 wherein said first power supply includes a first DC power connector and said second power supply includes a second DC power converter, said first DC power being adapted to convert 110/220 alternating current into +4 Volt direct current and said second DC power converter being adapted to convert 110/220 alternating current into +24 Volt direct current.

16. An adapter assembly comprising:
   a. a base having a front side and a back side, said base being adapted and arranged for supporting a HARRIS 117 radio;
   b. a first member extending upward from said base;
   c. a second member extending upward from said base;
   d. a plurality of power supplies housed within at least part said of said assembly;
   e. a first connector supported by said first member, said first connector being adapted and arranged for supplying power from at least one of said plurality power supplies to said HARRIS 117 radio; and
   f. a second connector supported by said second member, said second connector being adapted and arranged for supplying power from at least two of said plurality of power supplies to a radio frequency power amplifier adapted to amplify a radio frequency output of said HARRIS 117 radio.

17. The assembly according to claim 16 wherein said first member and said second member extend upward from said back side of said base.

18. The assembly according to claim 16 further including a speaker supported by said front side of said base.

19. The assembly according to claim 16 wherein said first connector includes a forward facing electrical mounting interface adapted to engage a complimentary connector of said HARRIS 117 radio.

20. The assembly according to claim 16 wherein said second connector includes a rear facing electrical mounting interface adapted to engage a complimentary connector/binding posts of said radio frequency power amplifier.

21. The assembly according to claim 16 wherein said first connector includes a forward facing electrical mounting interface adapted to engage a complimentary connector of said HARRIS 117 radio and said second connector includes a forward facing electrical mounting interface adapted to engage a complimentary connector of said radio frequency power amplifier.

22. The assembly according to claim 16 wherein said base is substantially rectangular.

23. The assembly according to claim 16 wherein said base includes low friction runners for arresting movement of said HARRIS 117 radio and said radio frequency power amplifier.

24. The assembly according to claim 16 further comprising an audio amplifier circuit in electrical connection between an internal speaker, second connector and a volume control for the main unit and an LS/671 external speaker.

25. The assembly according to claim 16 wherein said first member and second member extend upward from said backside of said base.

26. The assembly according to claim 16 further comprising said HARRIS 117 radio and said radio frequency power amplifier being electrically connected with said first connector, respectively.

27. An adapter assembly comprising:
   a. a base having a front side and a back side, said base being adapted and arranged for supporting a HARRIS 117 radio;
   b. a first member extending upward from said back side of said base;
   c. a first forward facing connector supported by said first member and adapted to engage a complimentary connector of said HARRIS 117 radio;
   d. a first power supply in electrical connection with said first forward facing connector; and
   e. a means for converting audio electric signals into audibly detectable sounds, wherein said means is supported by said base.

28. An adapter assembly according to claim 27 further comprising a second rear facing connector/binding posts supported by a second member and adapted to engage a complimentary connector of an radio frequency power amplifier.

29. An adapter assembly according to claim 28 further comprising a third power supply includes an audio amplifier circuit in electrical connection between a volume control and said speaker.

30. An adapter assembly according to claim 29 wherein said audio amplifier circuit includes means for electrically connecting with a microphone assembly.

31. The assembly according to claim 30 wherein said first power supply includes a first DC power converter adapted to convert alternating current into about +24 Volt direct current, and further comprising a second power supply includes a second DC power converter adapted to convert alternating current, into about +24 Volt direct current.

32. The assembly according to claim 27 further comprising said HARRIS 117 radio electrically connected with said first power supply.

33. The assembly according to claim 27 further comprising said HARRIS 117 radio connected with said first connector and a SATCOM/radio frequency power amplifier connected with said second connector.

* * * * *